United States Patent [19]

Jones et al.

[11] Patent Number: 4,562,363
[45] Date of Patent: Dec. 31, 1985

[54] METHOD FOR USING A CHARGE COUPLED DEVICE AS A PEAK DETECTOR

[75] Inventors: Roydn Jones, Aloha; Thomas P. Dagostino; Luis J. Navarro, both of Beaverton, all of Oreg.

[73] Assignee: Tektronix, Inc., Beaverton, Oreg.

[21] Appl. No.: 445,343

[22] Filed: Nov. 29, 1982

[51] Int. Cl.⁴ ............... H03K 5/153; G11C 19/28; H01L 29/78
[52] U.S. Cl. ............................ 307/351; 377/60; 377/63; 357/24
[58] Field of Search ................... 377/57–63; 357/24 R; 307/351

[56] References Cited

U.S. PATENT DOCUMENTS

| | | | |
|---|---|---|---|
| 3,760,202 | 1/1972 | Kosonocky | 307/304 |
| 4,035,821 | 7/1977 | Gunsagar et al. | 357/24 |
| 4,165,537 | 8/1979 | Engeler et al. | 365/45 |

Primary Examiner—Larry N. Anagnos
Assistant Examiner—Richard Roseen
Attorney, Agent, or Firm—Allston L. Jones; John P. Dellett; George T. Noe

[57] ABSTRACT

A charge coupled device (CCD) with separately addressable input signal gates is operated in the potential equilibrium mode. With properly selected voltage potentials the CCD can be used as a high speed linear detector of a variable analog signal without the need of preceeding independent sample and hold or peak detector circuits. The result is the efficient minimum/maximum detection of an analog signal in a fast-in/slow-out digitizer.

8 Claims, 27 Drawing Figures

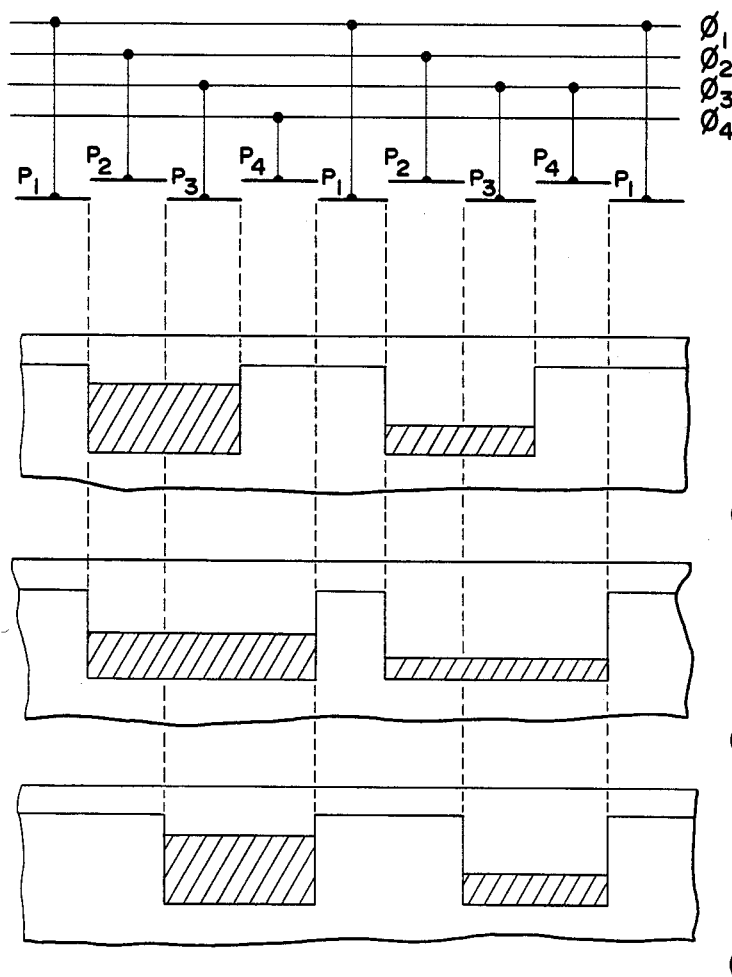
FIG. 3A. (PRIOR ART)
FIG. 3B. (PRIOR ART)
FIG. 3C. (PRIOR ART)
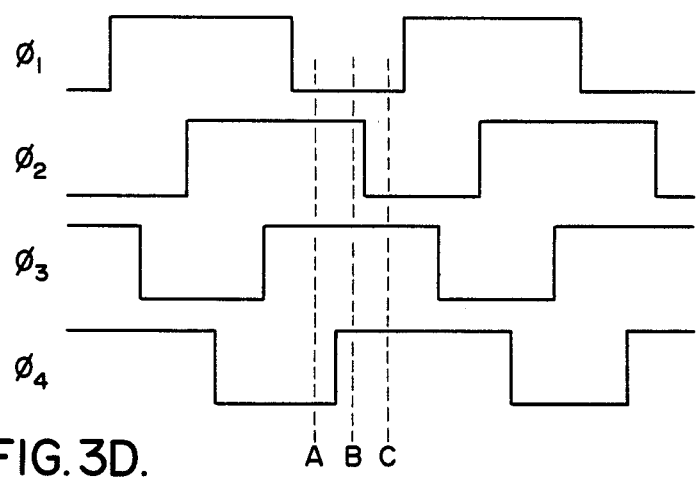
FIG. 3D. (PRIOR ART)

CHARGE DIAGRAM

CHARGE DIAGRAM

4,562,363

METHOD FOR USING A CHARGE COUPLED DEVICE AS A PEAK DETECTOR

BACKGROUND OF THE INVENTION

For digital oscilloscopes to compete with analog oscilloscopes in terms of bandwidth, there is a need for a high speed digitizer. Charge coupled analog shift registers operated in a fast-in/slow-out (FISO) mode offer a solution to the high speed digitizer requirement.

A problem with any data sampled system is that of aliasing. With a digital oscilloscope, aliasing can result in a waveform dissimilar to the input waveform. Various methods have been proposed to prevent the user from being "fooled" by the aliased information. One such method is "min-max" where the minimum and maximum of the input signal are measured during the sample period, and this "min-max" information is displayed. This method has proven to be a powerful tool in digital oscilloscopes. However, min-max requires a suitable method of detecting the minimum and maximum signal during each sample period. It would be convenient if the charged couple device (CCD) used for FISO digitization could also be used to provide a high speed min-max signal.

The basis of a charge coupled device itself is the MOS capacitor. FIGS. 1A and 1B show an isolated MOS capacitor formed by a metal electrode 10 deposited on a thermally oxidized 20 p-type silicon substrate 30.

If a positive voltage is applied to the metal electrode 10, the majority carriers in the silicon 30, holes in the case illustrated, are repelled and a potential well 40 is formed at the silicon surface. Initially this potential well is depleted of free carriers.

The channel stop diffusion 50 (p+ material) limits the lateral extension of the potential well 40 since it keeps the potential of the silicon dioxide-silicon interface near zero. Minority carriers (electrons) thermally generated in or near this potential well 40, will accumulate at the interface in an inversion layer 60.

It has become customary to think of the potential well as a bucket, and of the minority charge as a liquid that partially fills this bucket. The initial distribution of the interface potential 70, plotted with increasing positive value in the downward direction, is used schematically to depict the size of the empty bucket.

When electron charge is introduced under the electrode 10, the effect is to raise the interface potential 70 towards the silicon dioxide interface 80. The new interface potential 90 is represented schematically as the fluid surface of a partially filled bucket. The area between the two surfaces 80 and 90 gives a pictorial representation of the amount of charge much in the manner of a liquid sitting at the bottom of the bucket. It is important to remember that the real charge resides at the surface 80. This model is only useful in depicting qualitatively the processes in a CCD.

Now if two MOS capacitors are placed close together such that their depletion regions overlap, and their potential wells merge or 'couple' together, then any mobile minority charge will accumulate at the location with the highest interface potential. In terms of the fluid charge model we can say that the charge flows to the deepest part of the combined well.

We now have the basis for transferring charge in a controlled manner as shown in FIGS. 2A–2E from one electrode to an adjacent electrode. A charge packet injected under one electrode, P1, held at some potential, will spread along the silicon-silicon dioxide interface when the adjacent electrode P2 is turned on to the same or higher potential. When the potential on the first packet under P1 is reduced, the charge is completely transferred to the new location under P2. The timing diagram of the potentials on electrodes $P_x$ is shown in FIG. 2E for three phase operation.

Multiple devices can be tied together serially in this manner to form a charge coupled device. Several packets of charge can be transferred simultaneously along the device.

Normally charge transfer is required in one direction only (i.e. input to output). In order to achieve unidirectional transfer multiple clock phases are required. Four phase, three phase, and two phase devices have all been used successfully. FIG. 3 shows typical operation of a four phase device.

The CCD itself is thus a means to effectively transfer electrical charge and is conventionally used as a delay line for digital signals. The CCD has also been used as an analog delay line which can accept high speed analog information to be read out at slower, more convenient rates.

As an analog delay line the CCD has also been coupled with a separate high speed peak detector and sample and hold circuit for the detection of the minimum and maximum values of an analog signal. Thus in the prior art the CCD serves only as a delay mechanism, and not as a peak detector itself. When the electrical charge gets to the end of the CCD it can be slowly clocked out to an analog-to-digital converter (A/D) and the quantized. Unfortunately, such a system (high speed peak detector, plus sample and hold, followed by CCD delay line, followed by low speed A/D) requires a considerable amount of hardware and cost.

SUMMARY OF THE INVENTION

The present invention discloses a method of using a CCD as both a high speed peak detector and analog delay line without the need of separate circuitry. A conventional CCD with an input diode, two separately addressable input signal gates, and subsequent transfer electrodes is operated in the potential equilibration mode, also known as the "fill and spill" mode. With properly selected potentials on its inputs, the CCD can have a variable signal applied to one of the input gates with the result that the peak value (minimum or maximum) of the variable analog signal is propagated down the CCD delay line. The charge in the "fill and spill" method of charge injection has also proven to be very linear with respect to the value of the variable signal voltage which is important in an analog peak detector.

The input diffusion diode of the CCD is pulsed to a low potential so that charge is injected across a first potential barrier formed under a first signal gate. This charge also fills the potential well under a second signal gate. The input diode is then reverse biased by switching the diode input voltage to a higher potential $V_{IDH}$. During the reverse bias period of the input diode excess charge is drained away from under the second signal gate and into the input diode well until the potential under the second signal gate is equal to the barrier potential under the first signal gate after an equilibration period determined by the intercell impedances. If the first signal gate is held at a fixed potential and a variable analog signal is applied to the second signal gate, then the charge under the second signal gate at the end of the equilibration period is proportional to the minimum value of the variable analog signal during that period. On the other hand, if the variable analog signal is applied to the first signal gate and the second signal gate is held at a fixed potential, then the resulting charge under the second signal gate is proportional to the maximum value of the variable analog signal during the equilibration period.

In either case the charge under the second signal gate is then transferred to an adjacent first transfer capacitor by pulsing a first transfer electrode to a high potential. This packet of charge can then be transferred from one transfer capacitor to another as in conventional CCD operation. When the charge packet reaches the end of the CCD it can be slowly clocked out to a conventional quantizing A/D via a conventional output circuit such as a gate controlled MOSFET.

The result is a simplified circuit which permits the high speed linear detection of the minimum or maximum value of a variable analog signal which can then be digitized through convenient low speed techniques.

DETAILED DESCRIPTION OF THE DRAWINGS

FIG. 1A shows a cross section of a MOS capacitor used as a storage element and FIG. 1B is a pictorial representation of the charge storage in such a MOS structure.

FIGS. 2A–2D presents the potential well representation and FIG. 2E is a timing diagram of the drive waveforms for a three phase driven CCD.

FIGS. 3A–3C show the potential well representation, and FIG. 3D is a timing diagram of the drive waveforms, for a four phase driven CCD.

DETAILED DESCRIPTION OF THE INVENTION

One method of charge injection into a CCD is "fill and spill", also called potential equilibration. The present invention makes use of fill and spill in order to detect minimum and maximum excursions of an analog signal during each sample period.

The principle of fill and spill (or potential equilibration) is shown in FIGS. 4A–G for a CCD structure. The structure consists of an input diode (ID) followed by two separately addressable gates, G1 and G2. The subsequent electrodes are the regular transfer electrodes belonging to phase 1 through phase 4 (P1 to P4) of the CCD.

Figure 1A:
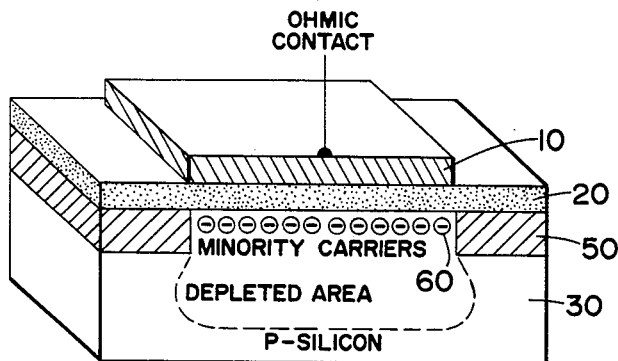
Figure 1B:
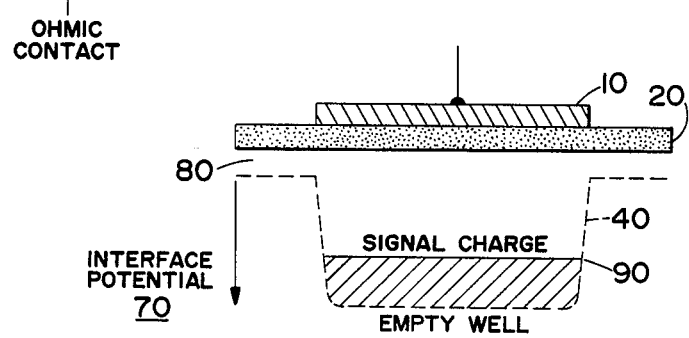
Figure 2A:
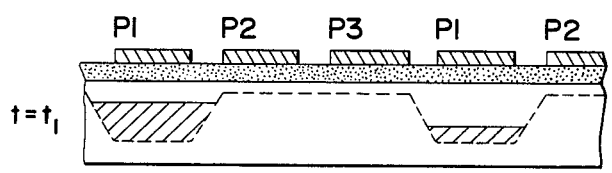
Figure 2B:
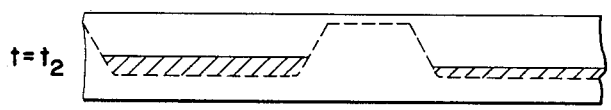
Figure 2C:
Figure 2D:
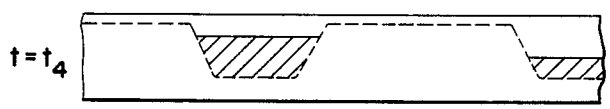
Figure 2E:
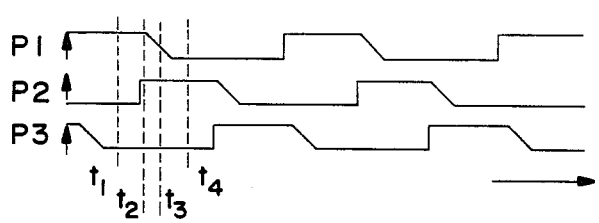
Figure 4A:
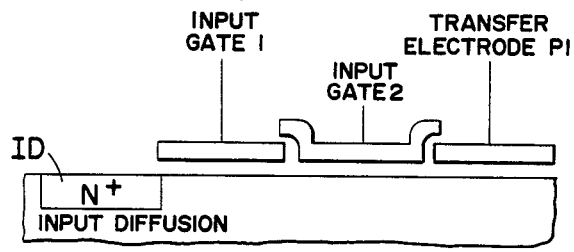
FIG. 4A represents a cross section of a CCD input structure according to the preferred embodiment of the present invention.
Figure 4B:
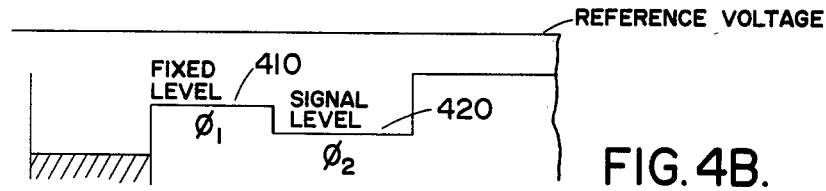
FIGS. 4B–4F represent the potential wells and FIG. 4G shows the drive waveforms for the preferred embodiment shown in FIG. 4A for use as a signal minimum detector.
Figure 4C:
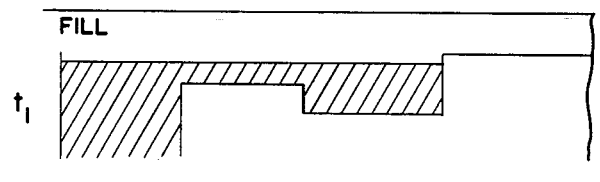
Figure 4D:
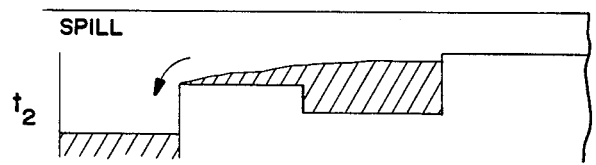
Figure 4E:
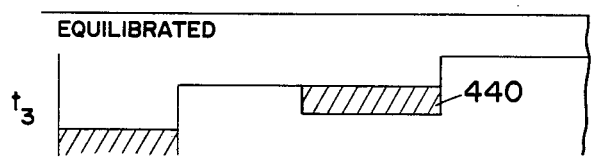
Figure 4F:
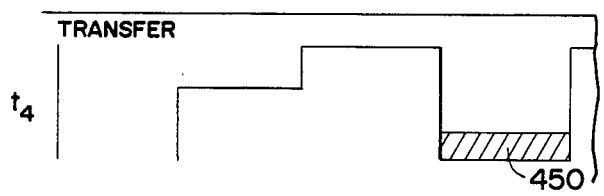
Figure 4G:
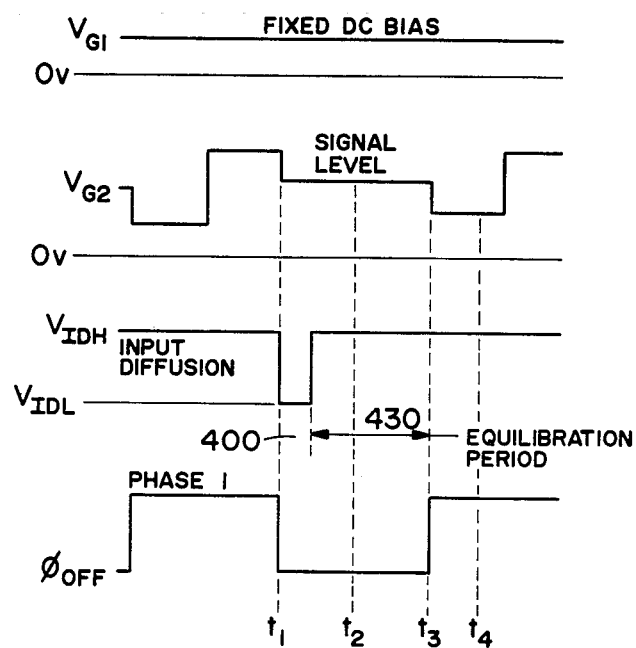
Figure 5A:
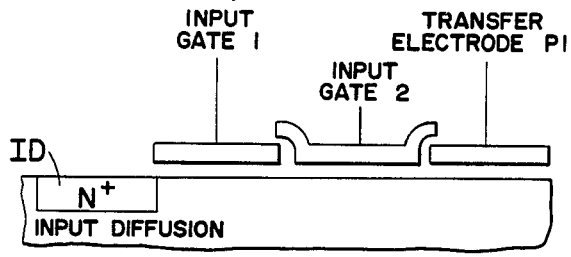
FIG. 5A represents a cross section of a CCD input structure according to the preferred embodiment of the present invention.
Figure 5B:
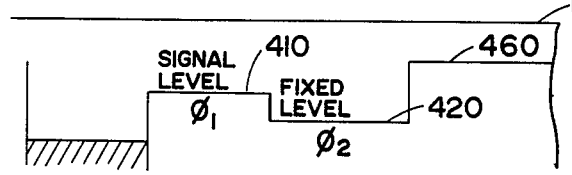
FIGS. 5B–5F represent the potential wells and FIG. 5G shows the drive waveforms for the preferred embodiment shown in FIG. 5A for use as a signal maximum detector.
Figure 5C:
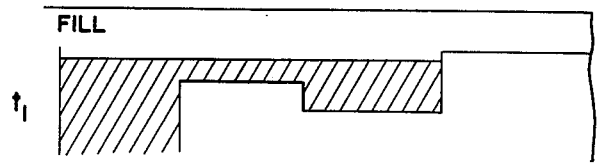
Figure 5D:
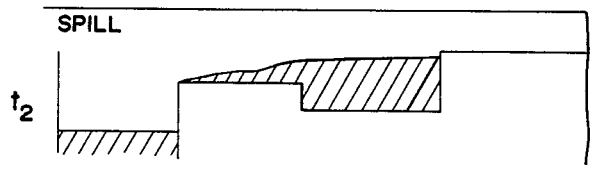
Figure 5E:
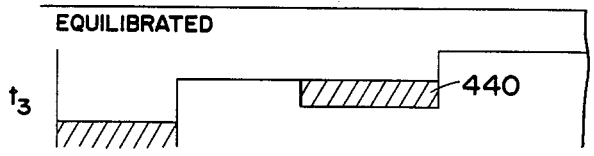
Figure 5F:
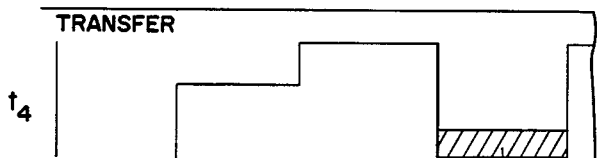
Figure 5G:
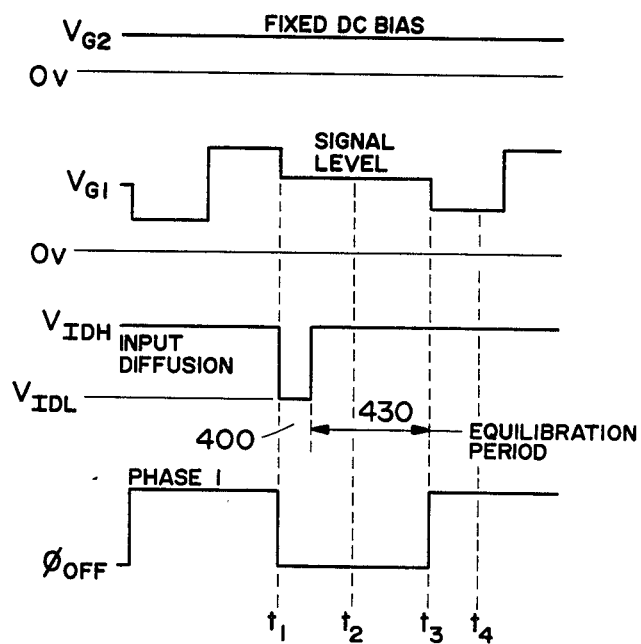

The timing/signal diagram of FIG. 4G represents the sequence of signals for measuring the minimum of the applied signal on Gate 2 during the period 430. As shown in the timing diagram of FIG. 4G, the input diode ID is pulsed to a low potential ($V_{IDL}$) at $t_1$ for a short period of time 400. During this "fill" period, charge is injected across the barrier 410 formed under gate G1 and fills the potential well 420 under G2. Then the input diode ID is reverse biased by switching to a higher potential $V_{IDH}$. During this reverse bias period 430, excess charge is drained from under G2 until the potential under G2 is equal to the barrier potential 410 under G1 at $t_3$ (hence the name potential equilibration). The final charge left beneath Gate 2 is representative of the minimum value of the signal applied to Gate 2 during the equilibration period 430.

An important requirement for the peak detection scheme using a CCD is that the discharge or spill time constant of the input must have a low value such that the charge under the sampling gate, G2 in this example, follows a decreasing signal applied to the sampling gate. The remaining charge 440 under Gate 2 at the end of the equilibration period ($t_3$) is then proportional to the minimum of the signal during that period. This charge 440 is then transferred as charge 450 under electrode P1 as shown in FIG. 4F.

In this method, the final potential 440 under the storage well $G_2$ is equal to the fixed potential 410 under the metering well $G_1$, independent of the signal voltage. If the potential under $G_1$ is $\phi_{G1}$, and the potential under $G_2$ due to $V_{signal}$ is $\phi_{G2}$, then after equilibration the charge stored under $G_2$ is:

$$Q_{SIG} = \int_{\phi_{G2}}^{\phi_{G1}} [C_{ox} + C_d(V)]dV$$

where $C_d(V)$ is a parasitic depletion capacitance of the potential wells and $C_{ox}$ is the silicon dioxide-silicon interface capacitance of each well $G_2$ and $G_1$.

If Gate 1 and Gate 2 have essentially identical electrical characteristics, then the terms due to the depletion capacitance $C_d(V)$ cancel out, and the signal charge is:

$$Q_{SIG} = C_{ox}(V_{SIG} - V_{IG1})$$

Since $V_{IG1}$ is a constant, then $Q_{SIG}$ is linear with signal voltage $V_{SIG}$.

FIGS. 5A–G similarly illustrate the operation of the CCD as a maximum peak detector. This is done by applying the variable signal to G1 and the fixed signal to G2. Thus, at the end of the equilibration period (430) the charge remaining beneath G2 is inversely proportional to the maximum potential that was on G1 during period 430.

For operation in this method of charge injection, the following conditions need to be met:

1. The low diode ID injection voltage ($V_{IDL}$) must be higher than the off potential ($\phi_{OFF}$) under the transfer electrodes P1–P4. This is to prevent charge from spilling beyond the first potential well 460.
2. The potential under G1 ($\phi_{G1}$) must be higher than $V_{IDL}$ so that charge can be injected across the barrier 410.
3. The potential under G2 at all times must be higher than $\phi_{G1}$, so that some charge can be retained in the equilibration process 430 (linear region).
4. The high diode voltage ($V_{IDH}$) must be higher than $\phi_{G1}$, so that $\phi_{G1}$ determines the equilibrated potential 440.

Figure 6:
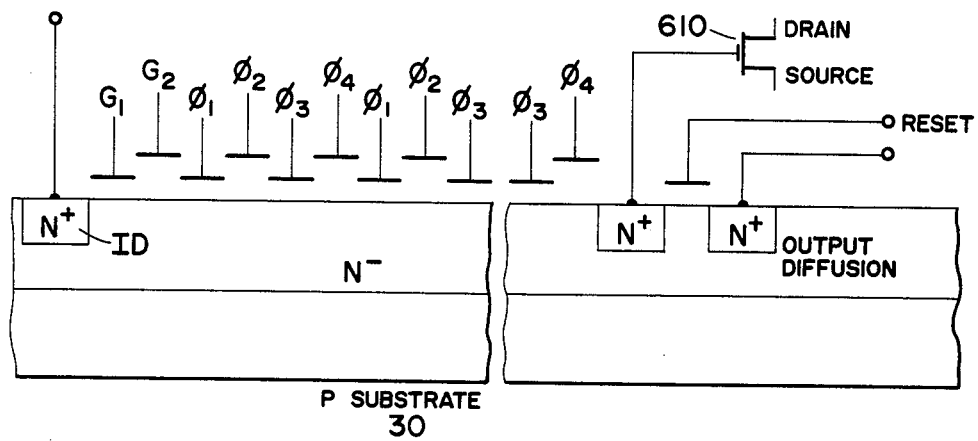
FIG. 6 shows an overall view of a CCD according to the preferred embodiment of the present invention.
Figure 7:
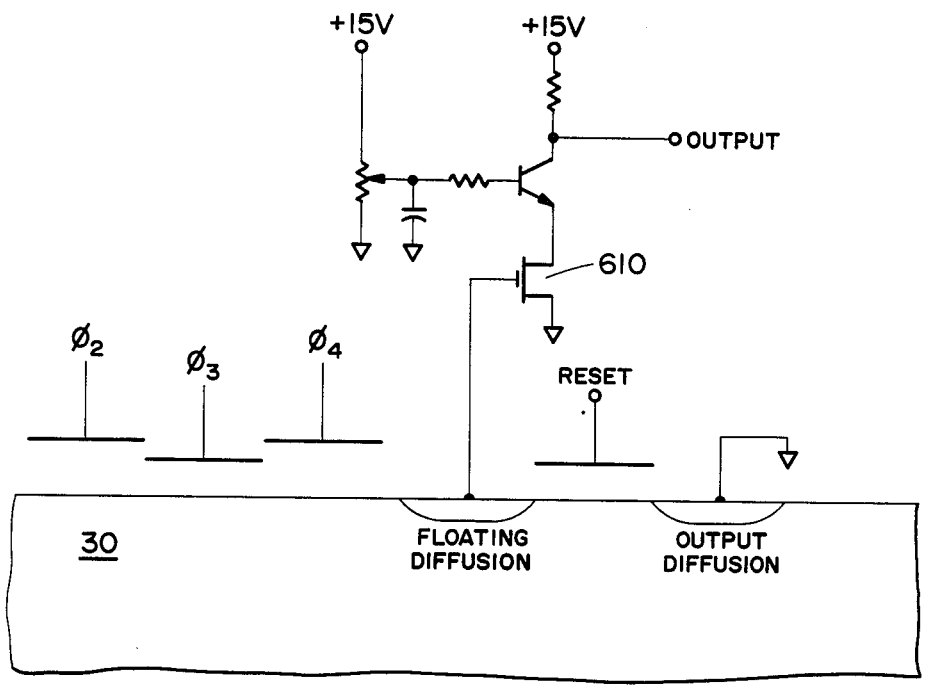
FIG. 7 shows a schematic representation of an output circuit for use with the preferred embodiment of FIG. 6.

A complete CCD is shown in FIG. 6 minus the serial CCD units in the broken central region. The min-max signal is propagated through a plurality of transfer gates $\phi_1$-$\phi_4$ from one CCD stage to the next as discussed above and is finally extracted by means of an output circuit 610 shown in detail in FIG. 7 by means of a MOSFET coupled to a floating diffusion. The FET output signal can then be digitized by means of a conventional low speed A/D converter.

We claim:

1. A method of detecting the maximum peak value of a selected signal utilizing a charge coupled device having, serially coupled one to the other, an input diode, a first signal gate means, a second signal gate means and at least one transfer means each having a plurality of transfer gates serially coupled one to the other, the method comprising the steps of:
   (a) applying a fixed potential on said second gate means to establish thereunder a potential well having a fixed level;
   (b) applying the selected signal on the first signal gate means to establish thereunder a potential well having a level which varies with said selected signal;
   (c) initializing the peak detector process by pulsing the input diode on so that charges are injected beneath the input diode and said first and second signal gate means, and then reverse biasing said input diode;
   (d) equilibrating the charge beneath said first and second signal gate means following the completion of step c, wherein the equilibration is carried out over a predetermined time interval during which level of the potential well under said first gate means varies while the level of the potential well under said second gate means remains fixed so that the equilibrated charge remaining under the second gate means at the end of said predetermined interval is representative of the maximum peak value of the selected signal during the interval; and
   (e) transferring the equilibrated charge beneath said second gate means to the transfer means.

2. A method as in claim 1 wherein step (c) includes the steps of:
   (f) applying the lowest potential of all signals applied to the charge coupled device to the first transfer gate of the transfer gate means to limit the injected charge to those regions beneath the input diode and said first and second signal gate means; and
   (g) applying the second lowest potential signal of all signals applied to the charge coupled device to the input diode to inject charge beneath the input diode and the first and second signal gate means.

3. A method as in claim 2 wherein the potential on said first and second signal gate means is greater than the potential on the input diode during step g and the potential on said second signal gate means is at all times greater than the potential on said first signal gate means.

4. A method as in claim 1 wherein the step (d) includes the steps of:
   (h) applying a higher potential to the input diode than the highest potential applied to the first signal gate means; and
   (i) maintaining the lowest potential of all signals applied to the charge coupled device to the first transfer gate of the transfer gate means to limit equilibration to the regions beneath the input diode and the first and second signal gate means.

5. A method as in claim 1 wherein step e includes the step of:
   (j) applying a sufficiently higher potential to the first transfer gate of the transfer means than the potential on the second signal gate means to transfer the charge from beneath the second signal gate to beneath the first transfer gate.

6. A method as in claim 1 wherein step e includes the step of:
   (k) serially transferring the charge from one transfer gate to the next to provide a selected measure of delay.

7. A method as in claim 6 wherein the method further comprises the step of:
   (l) outputting the charge from the last transfer gate;
   (m) converting the output of step 1 to a signal in a selected format, said signal being representative of the detected peak value of the selected signal.

8. A method as in claim 1 wherein said method further comprises the step of:
   (n) repeating steps (c), (d) and (e) a selected number of times for the signals applied in steps (a) and (b).

* * * * *